United States Patent
Proehl et al.

(10) Patent No.: US 7,639,109 B2
(45) Date of Patent: Dec. 29, 2009

(54) SENSOR COIL AND METHOD OF MANUFACTURING SAME

(75) Inventors: Gregory L. Proehl, Woodstock, IL (US); Craig Verdung, McHenry, IL (US); Steven W. Hickman, Wonder Lake, IL (US)

(73) Assignee: Coilcraft, Incorporated, Cary, IL (US)

( * ) Notice: Subject to any disclaimer, the term of this patent is extended or adjusted under 35 U.S.C. 154(b) by 0 days.

(21) Appl. No.: 12/019,359

(22) Filed: Jan. 24, 2008

(65) Prior Publication Data
US 2008/0169894 A1 Jul. 17, 2008

Related U.S. Application Data

(63) Continuation of application No. 10/792,616, filed on Mar. 3, 2004, now abandoned.

(60) Provisional application No. 60/452,697, filed on Mar. 7, 2003.

(51) Int. Cl.
*H01F 27/36* (2006.01)
(52) U.S. Cl. .................................. 336/84 C
(58) Field of Classification Search ............ 336/65, 336/83, 84 R, 84 M, 84 C, 208, 221; 324/244, 324/250, 253–255; 343/787–788
See application file for complete search history.

(56) References Cited

U.S. PATENT DOCUMENTS

| | | | |
|---|---|---|---|
| 3,899,834 A | 8/1975 | Harrison, Jr. | |
| 3,946,691 A | 3/1976 | Freeman | |
| 4,033,045 A | 7/1977 | Wing | |
| 4,139,951 A | 2/1979 | Cunard et al. | |
| 4,179,741 A | 12/1979 | Rossani | |
| 4,277,751 A | 7/1981 | Lawson et al. | |
| 4,851,775 A | 7/1989 | Kim et al. | |
| 4,859,944 A | 8/1989 | Webb | |
| 5,239,264 A | 8/1993 | Hawks | |
| 5,383,280 A | 1/1995 | McDermott | |
| 5,521,609 A | 5/1996 | Desch et al. | |

(Continued)

FOREIGN PATENT DOCUMENTS

EP 1037304 9/2000

OTHER PUBLICATIONS

PCT International Search Report and Written Opinion of the International Searching Authority dated Nov. 4, 2004 in corresponding International Application No. PCT/US04/06899.

*Primary Examiner*—Tuyen Nguyen
(74) *Attorney, Agent, or Firm*—Fitch, Even, Tabin & Flannery

(57) ABSTRACT

An electronic component in accordance with the invention includes a body, such as a base, having a high magnetic permeability material applied to an external surface thereof and a wire winding wound about at least a portion of the high magnetic permeability material. In a preferred form, the body is made of a non-conducting material, such as ceramic or plastic, and the high magnetic permeability material is made of a magnetic material such as ferrite or a metallic glass alloy (i.e., an amorphous metal). The component further includes a spacer for separating the wire winding from the high magnetic permeability material in order to prevent the amorphous metal from damaging the wire winding. The resulting electronic component is capable of sensing magnetic fields and may be used in a variety of circuits such as compasses and magnetometers.

18 Claims, 5 Drawing Sheets

U.S. PATENT DOCUMENTS

| | | |
|---|---|---|
| 5,642,046 A | 6/1997 | Hawks |
| 5,744,956 A | 4/1998 | Hawks |
| 5,749,150 A | 5/1998 | McDermott |
| 5,757,184 A | 5/1998 | Kurihara et al. |
| 5,764,055 A | 6/1998 | Kawase |
| 5,875,561 A | 3/1999 | Chen et al. |
| 6,084,406 A | 7/2000 | James et al. |
| 6,121,770 A | 9/2000 | Sudo |
| 6,181,130 B1 | 1/2001 | Hoshi et al. |
| 6,194,897 B1 | 2/2001 | Fukunaga |
| 6,243,660 B1 | 6/2001 | Hsu et al. |
| 6,380,657 B1 * | 4/2002 | Roth .................... 310/254 |
| 7,196,514 B2 * | 3/2007 | Li ........................ 324/249 |

* cited by examiner

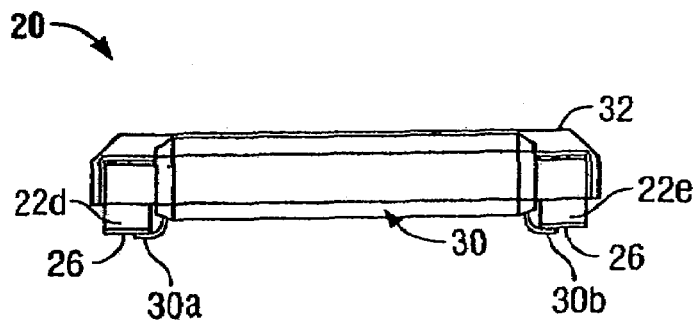
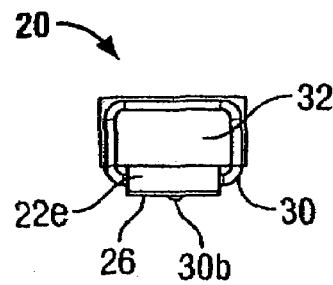
FIG. 1A
FIG. 1B
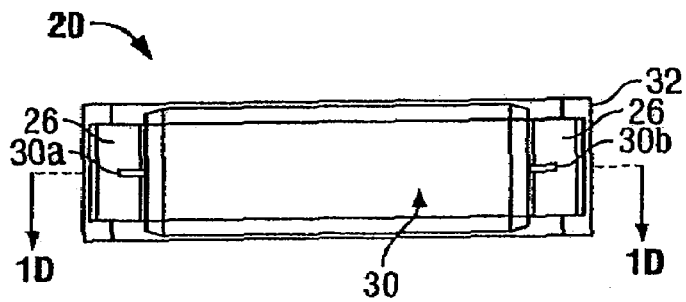
FIG. 1C
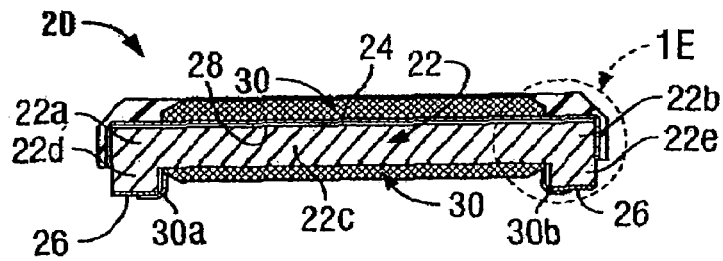
FIG. 1D
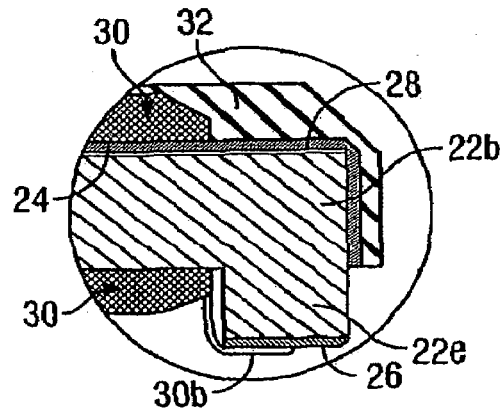
FIG. 1E

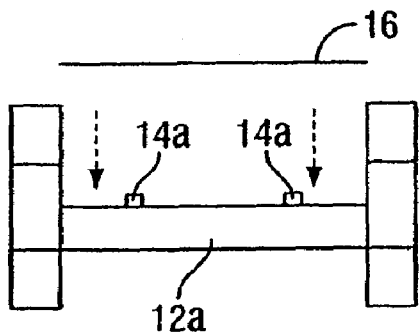
FIG. 5A
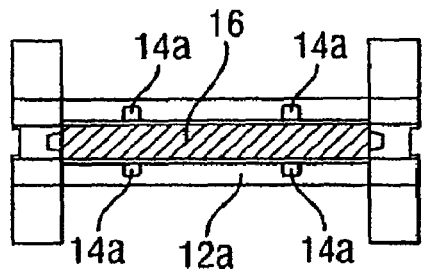
FIG. 5B
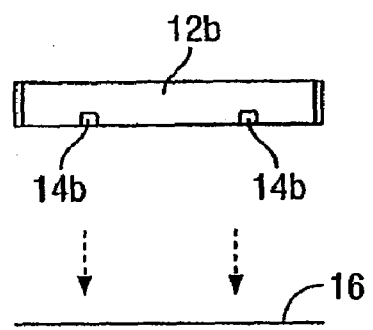
FIG. 5C
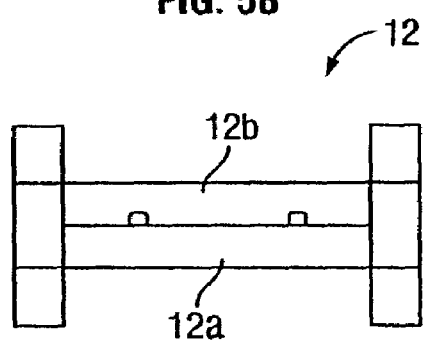
FIG. 5D
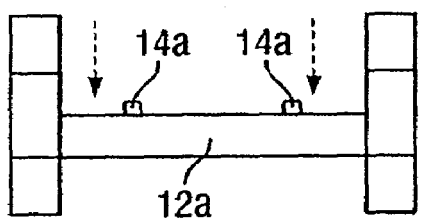
FIG. 5E
FIG. 5F
(Prior Art)

SENSOR COIL AND METHOD OF MANUFACTURING SAME

CROSS REFERENCE TO RELATED APPLICATIONS

This application is a continuation of prior application Ser. No. 10/792,616, filed Mar. 3, 2004, which claims benefit of Provisional Application No. 60/452,697, filed Mar. 7, 2003, which are hereby incorporated herein by reference in their entirety.

BACKGROUND OF THE INVENTION

This invention relates generally to electronic components and more particularly concerns low profile surface mountable sensing coils having a structure that improves the manufacturability and performance of the component.

The electronics industry provides a variety of wire wound components such as inductors which come in a variety of package types and configurations. For example, inductors may be provided in toroid, solenoidal, drum or sling-type packaging and in through-hole or surface mount configurations.

Of these coil components, some are used as sensors for detecting magnetic fields and rely on the use of highly permeable materials to detect the presence of such fields. For example, in U.S. Pat. No. 4,851,775, issued Jul. 25, 1989 to Kim et al., a digital compass and magnetometer are disclosed which use a solenoidal sensor coil having a wire-wound bobbin with an amorphous metal having a high magnetic permeability inserted therein for detecting magnetic fields. Improvements on these compass and magnetometer designs, as well as new applications for such sensor coils, are disclosed in U.S. Pat. No. 5,239,264, issued Aug. 24, 1993 to Hawks; U.S. Pat. No. 5,642,046, issued Jun. 24, 1997 to Hawks; U.S. Pat. No. 5,744,956, issued Apr. 28, 1998 to Hawks; U.S. Pat. No. 6,084,406, issued Jul. 4, 2000 to James et al.; and U.S. Pat. No. 6,243,660, issued Jun. 5, 2001. All of the above-mentioned patents are hereby incorporated herein by reference.

Although many advances have been made in the application of such sensor coils, most (if not all) of the available components continue to use a coil component configuration wherein the highly permeable amorphous metal layer is inserted into a plastic bobbin. The reason for this is that amorphous metals are extremely sharp and must therefore be prevented from rubbing against the wire windings. For example, if the wire winding is placed directly on the amorphous metal, the amorphous metal will eventually cut through the outer insulation of the wire and cause the component to short. In extreme cases, the amorphous metal may even cut the wire of the component causing the component to open (or operate as an open circuit).

To avoid such problems, the amorphous metal has traditionally been inserted into a plastic bobbin to isolate the amorphous metal from the wire winding. For example, in FIG. 1 of U.S. Pat. No. 6,084,406, a traditional sensor coil is disclosed in which plastic bobbin 13 isolates an elongated core of high dc permeability material 17 from electrically conductive wire 15. In another traditional coil sensor structure, a slot is provided in the bobbin for receiving the amorphous metal; however, in this configuration the amorphous metal is able to slide out of the slot and make contact with the wire winding hindering the use and marketability of this design.

Another example of a traditional coil sensor is illustrated in FIGS. 5A-F herein, and is identified generally by reference numeral 10. The coil sensor 10 includes a bobbin 12 having first and second bobbin portions 12a and 12b, respectively, which can be interconnected (e.g., snapped together) via a pair of post members 14a and post receiving recesses 14b. An amorphous metal 16 is sandwiched between the first and second bobbin portions 12a-b in order to isolate the amorphous metal 16 from the wire winding 18 which is wound about the interconnected bobbin 12.

One problem associated with the use of the above-mentioned sensor coil structures is the large gap that is created between the amorphous metal and the wire winding. More particularly, the gap created between the amorphous metal and the wire winding requires the winding to have many more turns in order to achieve the desired sensitivity for detecting magnetic fields. In other words, the larger the gap, the more turns the wire winding must have. Thus, the gap present in existing structures hinders the ability to make smaller and more efficient sensor coils with fewer number of turns.

Another problem associated with existing sensor coil structures is that it is difficult (if not impossible) to automate the assembly of such structures. More particularly, the necessity of inserting the amorphous metal into a bobbin to isolate it from the wire winding requires hand assembly of at least a portion of the component. This increases the amount of time and cost it takes to produce sensor coils and reduces the accuracy with which such components can be mass produced.

Accordingly, it has been determined that the need exists for an improved wire wound component and method for manufacturing the same which overcome the aforementioned limitations and which further provide capabilities, features and functions, not available in current devices and methods for manufacturing.

BRIEF DESCRIPTION OF THE DRAWINGS

FIG. 1A is a side elevational view of a coil component embodying features of the present invention;

FIG. 1B is an end view of the component of FIG. 1A;

FIG. 1C is a bottom view of the component of FIG. 1A;

FIG. 1D is a cross-sectional view of the component of FIG. 1A taken along lines D-D in FIG. 1C;

FIG. 1E is an blown-up view of the portion of the component identified as E in FIG. 1D;

FIG. 5A is a side elevational view of a portion of a traditional sensor coil showing the lower portion of a plastic bobbin with an amorphous metal exploded therefrom;

FIG. 5B is a plan view of the component of FIG. 5A, showing the amorphous metal positioned between the posts of the lower portion of the plastic bobbin;

FIG. 5C is a side elevational view of the component of FIG. 5A showing the upper portion of the plastic bobbin exploded therefrom;

FIG. 5D is a side elevational view of the component of FIG. 5C showing the upper and lower portions of the bobbin interconnected with one another;

FIG. 5E is a plan view of the component of FIG. 5D showing the interconnected bobbin portions; and FIG. 5F is a perspective view of the component of FIG. 5D showing wire wound around the interconnected bobbin portions.

DETAILED DESCRIPTION OF THE INVENTION

Figure 2A:
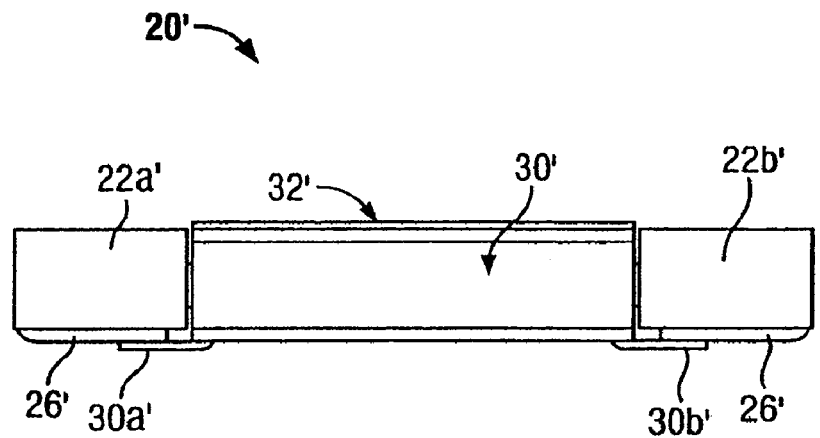
FIG. 2A is a side elevational view of an alternate coil component embodying features of the present invention.
Figure 2B:
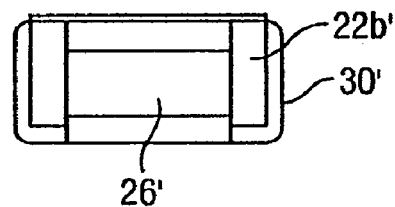
FIG. 2B is an end view of the component of FIG. 2A.
Figure 2C:
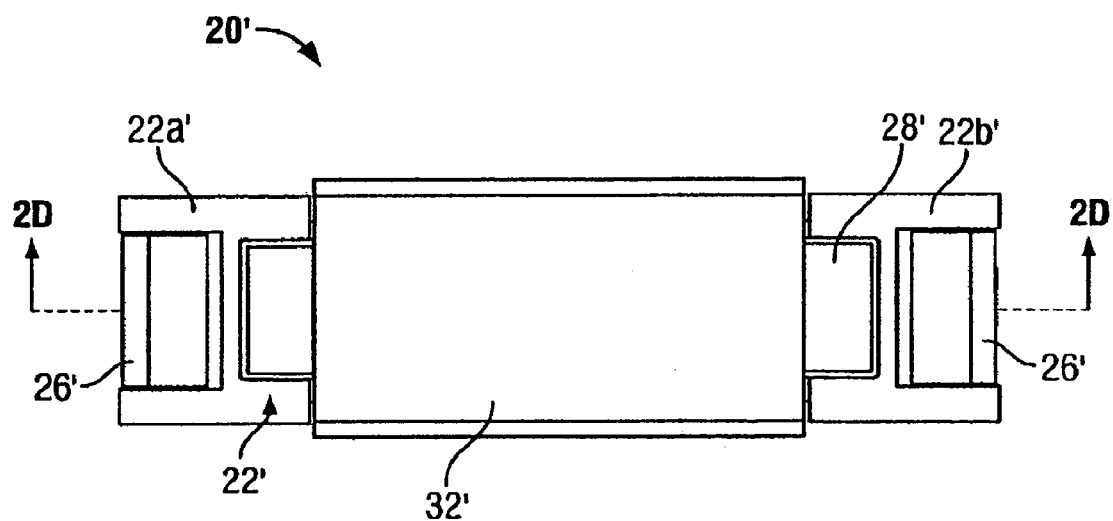
FIG. 2C is a plan view of the component of FIG. 2A.
Figure 2D:
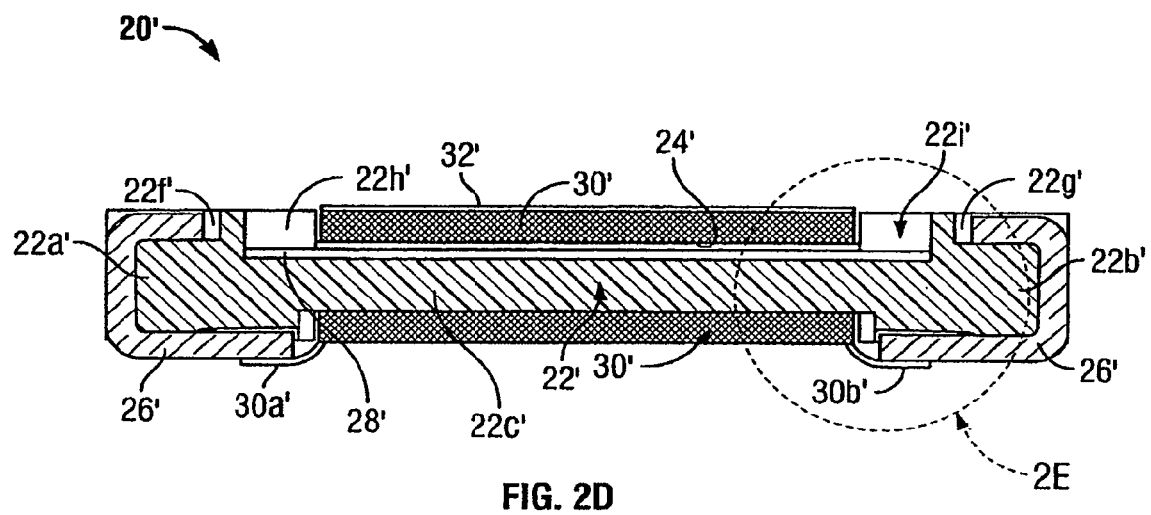
FIG. 2D is a cross-sectional view of the component of FIG. 2A taken along lines D-D in FIG. 2C.
Figure 2E:
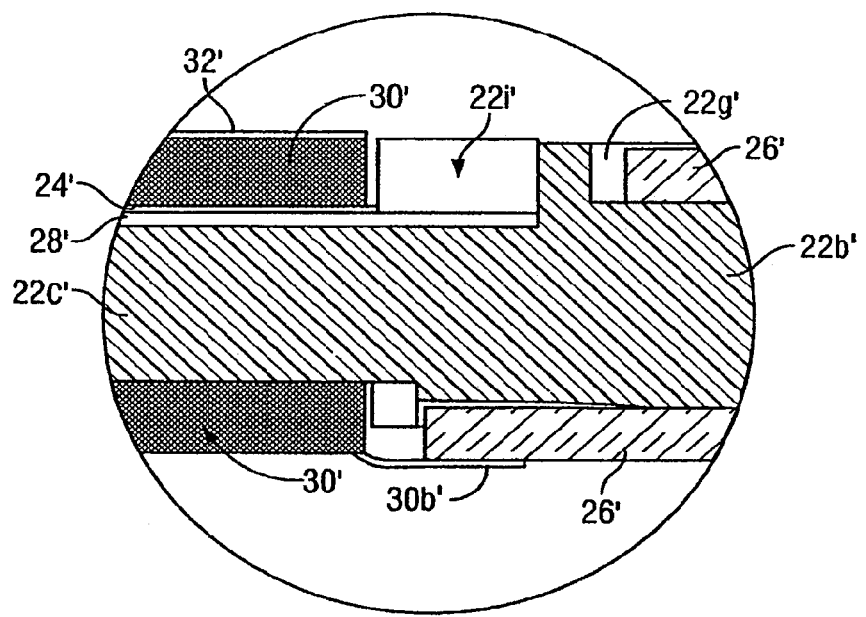
FIG. 2E is an blown-up view of the portion of the component identified as E in FIG. 2D.

An electronic component in accordance with the invention includes a body, such as a base, having a high magnetic permeability material applied to an external surface thereof and a wire winding wound about at least a portion of the high magnetic permeability material. In a preferred form, the body is made of a non-conducting material, such as ceramic or plastic, and the high magnetic permeability material is made of a magnetic material such as ferrite or a metallic glass alloy (i.e., an amorphous metal). The component further includes a spacer for separating the wire winding from the high magnetic permeability material in order to prevent the amorphous metal from damaging the wire winding. The resulting electronic component is capable of sensing magnetic fields and may be used in a variety of circuits such as compasses and magnetometers.

Turning first to FIGS. 1A-E, there is illustrated a wire wound inductive component 20 embodying features of the present invention. In the embodiment illustrated, the inductive component 20 is configured in a surface mount package for mounting on a PCB, which is, for convenience, described herein as it would be positioned on the upper surface of a PCB. For purposes of clarity, portions of the illustrations in FIGS. 1A-C are transparent in order to show the various parts of the component 20. However, in actuality these parts of the component 20 will likely be substantially or totally opaque.

The inductive component 20 includes a body, such as base 22, made of an insulating material, such as a non-conductive plastic or ceramic. The body 22 has a polygonal shape, such as a rectangle, and has first and second ends 22a and 22b, respectively, with an elongated portion 22c extending therebetween. The ends 22a-b and elongated portion 22c have upper surfaces which collectively form a smooth planer top surface.

In the illustrated embodiment, a pair of supports, such as legs 22d and 22e, extend downward from opposite ends of the body 22 and have metalized pads (e.g., soldering pads) located at the bottom thereof. The metalized pads 26 are made of a conductive material and are fused or bonded to the base 22 so that the component 20 may be electrically and mechanically attached to corresponding lands or traces located on the PCB via solder. More particularly, the metalized pads 26 provide an electrically conductive surface to which the solder paste printed on the PCB can bond once the component 20 and PCB are passed through a reflow oven. As is depicted in FIG. 1, each soldering pad 26 is generally flat and covers at least a portion of the bottom surface of the associated leg 22d or 22e.

In alternate embodiments, the pads 26 may cover at least a portion of the bottom and side surfaces of the legs 22d-e (e.g., L-shaped solder pads) in order to increase the surface area of the metalized pads 26, thereby strengthening the coupling between the metalized pads 26 and base 22, and between the metalized pads 26 and corresponding lands on the PCB. In other embodiments, U-shaped pads may be used which may extend across the lower surface and sides of legs 22d-e. Such pads provide even more surface area and connection strength between the base 22, pads 26, and corresponding PCB lands. In yet other embodiments, the component 20 may be designed without legs extending from the ends 22a-b of the base 22. Thus, with this configuration the bottom surfaces of ends 22a-b and elongated portion 22c may collectively form a generally planar bottom surface with the pads 26 being connected directly to the bottom surface of ends 22a-b.

The inductive component 20 further includes a core 28, which is preferably made of a magnetic material having a high magnetic permeability, such as a metallic glass alloy or amorphous metal. In alternate embodiments, however, it should be understood that other magnetic materials, such as ferrite, may be used as the core 28. In the illustrated embodiment of FIGS. 1A-E, the core 28 has a thin and generally rectangular structure such as a foil and has a tape backing to strengthen, stiffen or provide shape to the foil core 28 so that it can be worked with and installed more easily.

In order to avoid some of the problems associated with traditional sensor coils, the core 28 is applied to the generally flat upper surface of the base 22 formed by ends 22a-b and elongate member 22c and is preferably held in place via an adhesive such as glue, laminate or tape. This allows the component 20 to be manufactured more easily and with an automated process because the core 28 does not have to be inserted into the base 22 or any other external structure. Rather the core 28 is applied to an exterior surface of the base 22 which can be done more easily and via automated processes.

The inductive component 20 also includes a wire winding 30 which is wound about at least a portion of the core 28 and a portion of the base 22. In order to avoid other problems associated with traditional sensor coils, the core 28 is isolated from the wire winding 30 via a spacer 24. In the embodiment illustrated in FIGS. 1A-F, the spacer 24 includes a coating which encapsulates at least a portion of the core 28 and prevents this portion from coming into contact with the wire winding 30. Although the adhesive located on the upper surface of the core 28 could serve as the spacer 24, in a preferred embodiment, an insulating material such as a high temperature and flexible urethane is applied over the core 28 to isolate the core 28 from the wire winding 30.

More particularly, in some applications, the adhesive layer located on the upper surface of the core 28 shrinks due to its exposure to high temperatures. The shrinking of this adhesive layer can expose the wire winding 30 to the sharp edges of the core 28 and can therefore risk damaging the winding 30. Thus, by using a high temperature urethane coating 24, the possible shrinking of the adhesive layer located on the upper surface of the core 28 can be accounted for and can ensure that the spacer 24 continues to properly isolate the core 28 from the winding 30. High temperature urethanes are preferred because of their ability to withstand the extreme temperatures the component is exposed to, such as bonding and reflow oven temperatures, during product testing (e.g., product validation testing), and during operation of the component during its regular use (e.g., automotive temperature ranges). Adhesives are often incapable of withstanding such temperatures without experiencing some form of thermal stress (e.g., thermal expansion or contraction). Although, the adhesive layer located on top of the core 28 makes the core material easier to work with and apply, it should be understood that the presence of the adhesive is not essential and the component 20 can be constructed without this layer if need be.

In a preferred embodiment, the urethane coating 24 is applied uniformly over the upper surface of the core 28 and is of minimal height in order to minimize the amount of distance or gap between the core 28 and the wire winding 30. By providing a thin film of coating 24 and reducing the gap between core 28 and wire winding 30, the component 20 requires fewer turns of wire 30 in order to reach the same level of sensitivity as conventional sensor coils. Thus, the component 20 is capable of being produced in a smaller, more low profile package. It should be understood however that additional windings may be added to achieve a desired component performance and/or component size.

In a preferred embodiment, the wire 30 is an insulated wire such as a forty-four gauge copper wire having ends 30a and 30b connected to the bottom of the metalized pads 26. The insulation prevents the turns of the wire winding 30 from shorting out and ensures current will pass through the wire and around the core 28 in order to achieve the desired inductive effect. In the embodiment illustrated, the insulation of wire 30 includes a nonconductive nylon coating. It should be understood, however, that any conductive material may be used for the wire 30 and that the wire size may be selected from a variety of wire gauges. For example, a preferred component may use wire ranging from thirty-four gauge wire to forty-eight gauge wire, while alternate components may use different wire gauge ranges. It should also be understood that any insulating or non-conducting material may be used for the wire coating, not just nylon.

The ends of the wire 30a-b are preferably flattened (not shown) and bonded to the metalized pads 26 in order to minimize the amount of space between the lower surface of the metalized pads 26 and the upper surface of the corresponding PCB lands. This helps maintain the low profile of the component 20 and also helps ensure that the component will remain co-planar when positioned on the PCB so that the pads 26 and wire ends 30a-b will make sufficient contact with the solder on the PCB and make solid electrical and mechanical connections to the circuit on the PCB.

In alternate embodiments, the wire ends 30a-b may be connected to the outer side surfaces of L-shaped metalized pads, or inner or outer side surfaces of U-shaped metalized pads, in order to avoid disrupting the flat bottom surface of pads 26 and in order to avoid increasing the height of the component 20 and/or creating a gap between any portion of the pads 26 and the corresponding PCB lands. In yet other embodiments, notches or dimples may be present in the lower surfaces of the legs 22d-e and/or pads 26 in order to provide a designated location for the wire ends 20a-b to be bonded to the pads 26 without raising the height of the component 20 or creating an excessive gap between the pads 26 and corresponding PCB lands.

Once the wire 30 is wound about the elongated portion 22c and core 28, a cover 32 is applied over at least a portion of the upper most surface of the wire 30. In a preferred embodiment, the cover 32 may comprise an overmolding, a film or a cap, and is provided to form a generally flat upper surface with which the component 20 may be picked and placed using traditional pick-and-place equipment, (e.g., vacuum or suction pick-and-place machines). In a preferred embodiment, the cover 32 is made of a non-conductive material and may also provide a surface upon which the component manufacturer may print indicia such as product numbers, trademarks, and other desirable information. In the embodiment illustrated in FIGS. 1A-E, the cover 32 is also a high temperature urethane coating which forms an overmolding over a portion of the wire 30 and the spacer coating 24. It should be understood that in alternate embodiments, the cover 32 may be a film similar to that which will be discussed with respect to FIGS. 2A-E or a plastic cap inserted onto the component.

In a preferred embodiment, the pieces of the inductive component 20, are assembled by attaching metalized pads to the base 22, applying the core material 28 to an external surface of the base 22, attaching a spacer 24 to an external upper surface of the core 28, wrapping wire 30 about at least a portion of the base 22 and core 28, and attaching a cover 32 over a portion of the component 20 to form a generally flat upper surface thereon.

In the embodiment illustrated, the metalized pads 26 are attached to the base 22 via a thick film metalization process and the core material 28 is applied to the external surface of the base 22 via an adhesive. The core 28 extends over at least a majority of the upper surface of the base 22 and is preferably applied in a thin uniform layer. The spacer coating 24 is molded onto the base 22 and core 28 and extends along the upper surface thereof and over a portion of the external side surfaces of the ends 22a-b of base 22. Then wire 30 is wound about a portion of the core 28 and the base 22 and the wire ends 30a-b are bonded to metalized pads 26. More particularly, wire 30 is wound about the elongated portion 22c of base 22 and the core material positioned thereon, and the ends 30a-b are bonded to the pads 26 located on the bottom surfaces of legs 22d-e, respectively. Lastly, the cover 32 is applied to the component via a molding process. The overmolded cover 32 (or overmolding) extends along the upper surfaces of the wire 30 and the spacer coating 24, and over the portion of the spacer coating 24 which extends over the external side surfaces of ends 22a-b. With this configuration, the component 20 overcomes the aforesaid problems associated with traditional sensor coils and provides an electronic component which can be efficiently manufactured and mass produced.

Turning now to FIGS. 2A-E, there is illustrated an alternate embodiment of the component 20 embodying features in accordance with the present invention. In this embodiment, a differently shaped base is used in connection with the component 20. For convenience, features of alternate embodiments illustrated in FIGS. 2A-E that correspond to features already discussed with respect to the embodiments of FIGS. 1A-E are identified using the same reference numeral in combination with an apostrophe or prime notation (') merely to distinguish one embodiment form the other, but otherwise such features are similar.

The alternate embodiment of component 20, (hereinafter component 20'), includes a body such a base 22' which is made of an insulating material, such as a non-conductive plastic or ceramic. Like base 22 above, base 22' has a polygonal shape, such as a rectangle, and has first and second ends 22a' and 22b', respectively, with an elongated portion 22c' extending therebetween. However, base 22' has a general I-shape configuration with the ends 22a'-b' forming opposed flanged ends of the base 22'. Whereas base 22 discussed above has a general C-shape configuration which may be of a higher profile.

In a preferred embodiment, the ends 22a'-b' of body 22' define recesses 22f' and 22g' to which metalized pads 26' are connected for electrically and mechanically attaching the component 22' to corresponding lands on a PCB. More particularly, body 22' defines generally rectangular recesses 22f'-g' which extend into and wrap about the upper, side and bottom external surfaces of the base 22'. Preferably, the metalized pads 26' are in the form of clips which, in the embodiment illustrated, are capable of frictionally engaging at least a portion of the recesses 22f'-g' so as to secure the metalized pads 26' thereto. The portion of clip recesses 22f' and 22g' which is defined on the lower surfaces of the base 22' is tapered or angled in order to allow the clip 26' to secure itself onto the base 22'. In other words, ends 22a'-b' of base 22' form tenons which are inserted into mortises defined by the metalized pads 26'. The lower surfaces of the tenons are angled to form a flanged surface to prevent the clip 26' from unintentionally being removed.

It should be understood, however, that the metalized pads 26' may be secured to the base 22' in a variety of other ways, such as by gluing, using a ball and detent system, or providing a tooth or teeth members to secure the pad 26' to the base 22'. Moreover, in alternate embodiments, the base 22' may not have recesses 22f'-g' and the metalized pads 26' may be clipped on to the external surfaces of the ends 22a'-b' or may be attached to the base in a manner similar to that discussed above with respect to component 20, (e.g., using flat, L-shaped or U-shaped soldering pads).

In FIGS. 2A-E, the ends 22a'-b' further define recesses 22h' and 22i' which are generally rectangular in shape and have inner surfaces which are generally flush with the upper surface of the elongated portion 22c' of base 22'. Thus, the upper surface of elongated portion 22c' and recesses 22h'-i' collectively form a generally planar exterior surface of the base 22'.

The component 20' further includes a core 28' which is preferably made of a magnetic material having a high magnetic permeability such as an amorphous metal. As discussed above with respect to component 22, however, it should be understood that other magnetic materials such as ferrite may also be used for core 28'. In the illustrated embodiment in FIGS. 2A-E, the core 28' is preferably rectangular in shape and configured so that it may be applied to the generally planar exterior surface defined by elongated portion 22c' and recesses 22h'-j'. This allows the component to be manufactured more easily and with an automated process.

A spacer 24' is attached to the core 28' in order to isolate the core 28' from wire 30' which is wound about at least a portion of the base 22' and core 28'. In a preferred embodiment, the spacer 24' comprises a high temperature, flexible urethane coating which may be attached to the base 22' and core 28' in a manner similar to that discussed above with respect to component 22. Unlike component 22, however, the spacer coating 24 illustrated in the embodiment of FIGS. 2A-E does not extend over the entire external upper surfaces of the core 28' and base 22' and does not wrap around the sides of the base ends 22a'-b'. Rather, in this embodiment, the coating 24' is only attached to the portion of the core 28' which is directly below the windings of wire 30'. This configuration reduces the amount of materials needed and the amount of time it takes to apply such materials. In other embodiments, the coating 24' may be attached to the entire upper surface of core 28' if desired.

The coating 24' is preferably applied in a uniform and thin manner, such as a foil, in order to minimize the gap created between the core 28' and wire 30'. Thus, the component 22' is also capable of being produced in a smaller, low profile package and is capable of reaching better sensitivity levels with less windings as compared to traditional sensor coils.

After the spacer 24' is attached to the component 22', wire 30' is wound about the elongated portion 22c' and core 28' and its ends 30a'-b' are connected to the metalized pads 26'. As discussed above, the wire ends 30a'-b' may be connected to any of the surfaces of the metalized pads 26' and are preferably flattened and bonded to the lower surface thereof to ensure optimal connection between the wire 30' and PCB circuit via solder. As mentioned above, the wire 30' may be selected from a variety of different gauge wires having appropriate insulation to prevent the component 22' from shorting out.

Once the wire 30' is wound about the elongated portion 22c' and core 28', a cover 32' is applied over at least a portion of the upper most surface of the wire 30'. Unlike the component 20, the cover 32' used in the illustrated embodiment of FIGS. 2A-E is a film rather than a coating. More particularly, in a preferred embodiment film 32' is a fibrous material having an adhesive layer and may be positioned over the top of base 22', core 28' and/or winding 30'. Once attached to the component 20', the film 32' provides a generally flat or planar top surface with which the component may be picked up out of a tape-and-reel packaging and placed on a PCB using industry standard pick-and-place equipment.

In one form, film 32' may have an adhesive layer on the bottom and a printable layer on the top. Thus, in addition to providing the component 20' with a generally flat upper surface, the film 32' provides the component manufacturer with a surface for printing indicia such as product numbers, trademarks, and other desirable information. In a preferred embodiment, film 32' may be a polyimide film, a polyetheretherketone (PEEK) film, a liquid crystal polymer (LCP) film or the like. This component configuration allows the component 20' to be manufacture more efficiently and in a manner that avoids the aforesaid problems associated with conventional sensor coils.

It should be understood, however, that in alternate forms the film 32' may be cut to different shapes and sizes. For example, in an alternate embodiment the film 32' may extend over the entire upper surfaces of the wire 30', the base ends 22a'-b', and the metalized pads 26'. Alternatively, in other embodiments, the film 32' may cover only a portion of the upper surface of the wire 30'. Furthermore, as mentioned above, the cover 32' may alternatively be a cap or a coating instead of a film.

Figure 3:
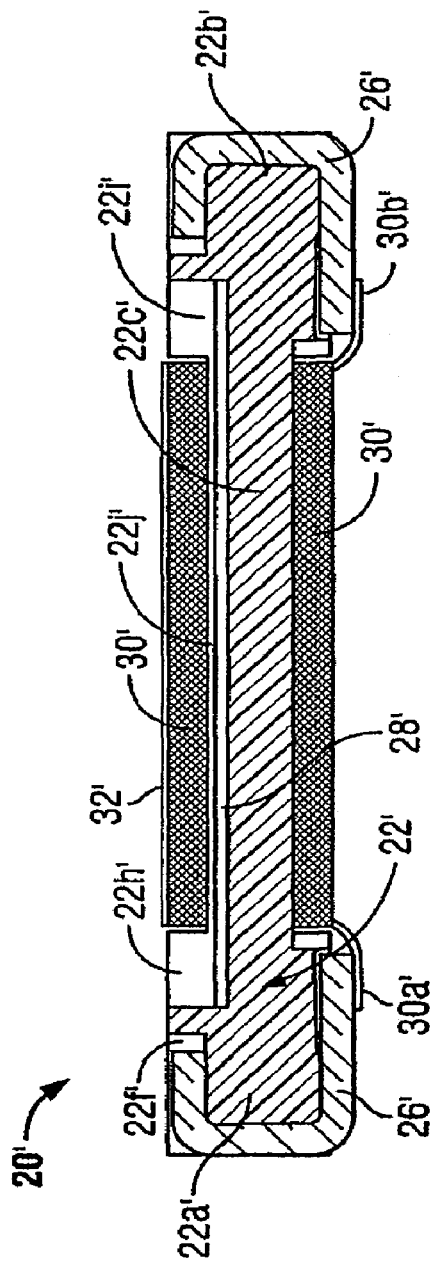
FIG. 3 is a cross-sectional view of an alternate coil component embodying features of the present invention illustrating a similar component to that of FIGS. 2A-E and taken along a similar line to that of D-D in FIG. 2C.

In FIG. 3, there is illustrated yet another embodiment of the component 20' embodying features in accordance with the present invention. In this embodiment, the spacer 24' comprises a wall or pair of walls extending upward from the upper surface of the base 22' (hereinafter spacer wall 22j') instead of a coating as discussed above. More particularly, in the embodiment shown, the spacer includes spacer walls 22j' extending up from opposite sides of the elongated portion 22c' of base 22'. The walls 22j' extend along the outer edge or partial perimeter of the upper surface of the elongated portion 22c' and support and prevent the windings of wire 30' from coming into contact with the core 28'. It should be understood, however, that in alternate embodiments a single wall or a plurality of walls or posts may be provided in place of the spacer walls illustrated.

As discussed above with respect to component 20', the core 28' is applied to the generally flat or planar surface located between the walls 22j' and defined by the upper surface of the elongated portion 22c' and the recesses 22h'-i'. Thus, walls 22j' form a spanning structure which isolates the core 28' from the wire 30' by creating an air gap therebetween. In a preferred embodiment, the height of spacer walls 22j' is set at the minimal amount needed in order to prevent the core 28' and wire 30' from contacting one another. This minimizes the air gap between the core 28' and wire 30' and allows the component to operate more efficiently with fewer windings. Thus, this configuration also allows the component 20' to overcome the problems set forth above with respect to traditional sensor coils. Another advantage to this configuration is that it uses existing materials for the spacer 24' rather than requiring additional materials to be applied to the component 20'. By eliminating the need for this material, the component 20' may be manufactured faster and at less cost.

In the embodiments illustrated in FIGS. 2A-E and 3, the metalized pads 26' are attached to the base 22' via a thick film metalization process and the core material 28' is applied to the external surface of the base 22' via an adhesive. The core extends over at least a majority of the upper surface of the base 22' and is preferably applied in a thin uniform layer. If the spacer 24' is a coating as illustrated in FIGS. 2A-E, the spacer coating may be molded onto the base 28' and extends along the upper external surface of the core 28'. If the spacer 24' is a wall, such as spacer wall 22j' in FIG. 3, no additional steps are likely to be needed in order to apply the spacer 24' to the component 20' as it will likely be an integral part of the base 22'. Then wire 30 is wound about at least a portion of the core 28' and the base 22', and the wire ends 30a'-b' are bonded to metalized pads 26'. More particularly, wire 30' is wound about the elongated portion 22c' of base 22' and the core material positioned thereon, and the ends 30a'-b' are bonded to the portion of the pads 26' located below the base 22'. Lastly, cover 32' is applied to the component. In a preferred embodiment, the film 32' is a film having an adhesive layer with which the film may be attached to the component 20'. With this configuration, the component 20' overcomes the aforesaid problems associated with traditional sensor coils and provides an electronic component which can be efficiently manufactured and mass produced.

In a preferred embodiment, the components 20 and 20' are low profile surface mount components with heights ranging between 2 mm and 0.5 mm or smaller. For example, the components 20 and 20' illustrated above may have lengths of approximately 6.0 mm to 14.0 mm, widths of approximately 3.0 mm to 6.0 mm, and heights of approximately 0.5 mm to 3.0 mm. It should be understood, however, that these dimensions are only exemplary and may vary individually or as a whole depending on the application for which the component is being designed.

Figure 4:
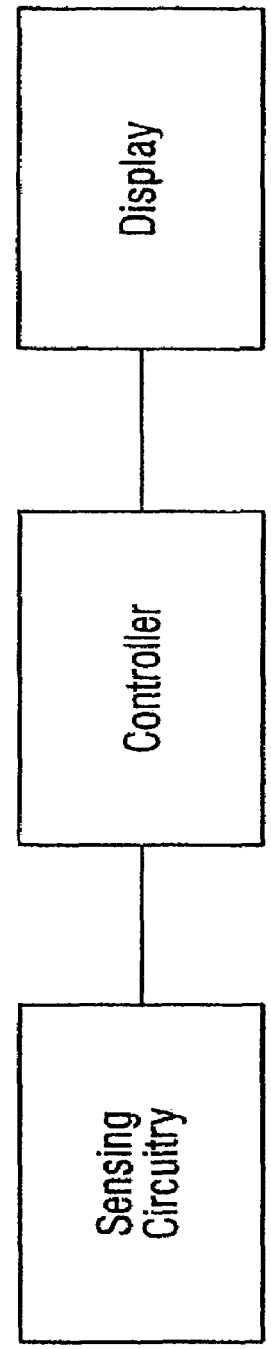
FIG. 4 is a block diagram illustrating a magnetic sensor using a sensing coil embodying features of the present invention.

The electronic component disclosed herein may be used in a variety of applications including those requiring the detection or sensing of magnetic fields. As illustrated in FIG. 4, the electronic components 20 and 20' may be used in conjunction with a controller, such as a microcontroller or other processor such as a microprocessor, gate array or the like, in order to detect magnetic fields and, which in turn may display data on a display corresponding to the detected fields. For example, the component 20 and 20' may be used in any of the compasses, magnetometers, or other devices disclosed in the patents mentioned above in the Background of the Invention.

Thus, in accordance with the present invention, a wire wound component is provided that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. An electronic component for sensing magnetic fields comprising:
    a body having first and second ends with an elongated portion extending therebetween;
    an amorphous metal connected to an external surface of the elongated portion of the body;
    a wire winding wrapped about at least a portion of the amorphous metal;
    a spacer for separating the wire from the amorphous metal in order to prevent the amorphous metal from damaging the wire, wherein the spacer comprises a coating extending over an external surface of the amorphous metal for isolating the amorphous metal from the wire.

2. An electronic component according to claim 1 wherein the coating is a high temperature and flexible urethane.

3. An electronic component according to claim 1 wherein the coating is connected to the external surface of the amorphous metal via an adhesive.

4. An electronic component according to claim 1 further comprising an overmolding covering at least a portion of the wire winding and providing a generally flat surface to assist in positioning of the component on a printed circuit board (PCB).

5. An electronic component according to claim 4 wherein the overmolding comprises at least one of a high temperature urethane and an adhesive film.

6. An electronic component according to claim 1 wherein the ends of the body extend downward from the elongated portion and have metalized pads connected to a portion thereof for electrically and mechanically attaching the component to a PCB.

7. An electronic component according to claim 1 wherein the elongated portion and ends of the body form an external upper surface and the coating extends over at least a portion of the external upper surface and down external side portions of the ends.

8. An electronic component according to claim 1 wherein the ends of the body define generally rectangular recesses wherein the elongated portion and the recesses form a generally planar surface upon which the amorphous metal is positioned.

9. An electronic component according to claim 8 wherein the ends of the body further define a second set of recesses to which metalized pads are connected for electrically and mechanically attaching the component to a PCB.

10. An electronic component for sensing magnetic fields comprising:
    a body having first and second ends with an elongated portion extending therebetween;
    an amorphous metal connected to an external surface of the elongated portion of the body;
    a wire winding wrapped about at least a portion of the amorphous metal;
    a spacer for separating the wire from the amorphous metal in order to prevent the amorphous metal from damaging the wire; and
    terminals connected to the electronic component for surface mounting the electronic component to a circuit;
    wherein the spacer comprises a pair of wall members extending from the elongated portion of the body, the wall members for supporting at least a portion of the wire winding and creating an air gap between the amorphous metal and the winding, wherein the ends of the body define generally rectangular recesses wherein the elongated portion located between the pair of wall members and the recesses form a generally planar surface upon which the amorphous metal is positioned.

11. An electronic component according to claim 10 wherein the ends of the body further define a second set of recesses to which metalized pads are connected for electrically and mechanically attaching the component to a PCB.

12. An electronic component according to claim 11 wherein metalized pads are in the form of clips capable of frictionally engaging at least a portion of the second set of recesses defined by the ends of the body.

13. An electronic component for sensing magnetic fields comprising:
- a body having first and second ends with an elongated portion extending therebetween;
- an amorphous metal connected to an external surface of the elongated portion of the body;
- a wire winding wrapped about at least a portion of the amorphous metal;
- a spacer for separating the wire from the amorphous metal in order to prevent the amorphous metal from damaging the wire; and
- terminals connected to the electronic component for surface mounting the electronic component to a circuit, wherein the spacer comprises a coating extending over an external surface of the amorphous metal for isolating the amorphous metal from the wire.

14. An electronic component for sensing magnetic fields comprising:
- a body having first and second ends with an elongated portion extending therebetween;
- an amorphous metal connected to an external surface of the elongated portion of the body;
- a wire winding wrapped about at least a portion of the amorphous metal;
- a spacer for separating the wire from the amorphous metal in order to prevent the amorphous metal from damaging the wire; and
- terminals connected to the electronic component for surface mounting the electronic component to a circuit, and a coating wherein the coating is a high temperature and flexible urethane.

15. An electronic component for sensing magnetic fields comprising:
- a body having first and second ends with an elongated portion extending therebetween;
- an amorphous metal connected to an external surface of the elongated portion of the body;
- a wire winding wrapped about at least a portion of the amorphous metal;
- a spacer for separating the wire from the amorphous metal in order to prevent the amorphous metal from damaging the wire; and
- terminals connected to the electronic component for surface mounting the electronic component to a circuit, and a coating wherein the coating is connected to the external surface of the amorphous metal via an adhesive.

16. An electronic component for sensing magnetic fields comprising:
- a body having first and second ends with an elongated portion extending therebetween;
- an amorphous metal connected to an external surface of the elongated portion of the body;
- a wire winding wrapped about at least a portion of the amorphous metal;
- a spacer for separating the wire from the amorphous metal in order to prevent the amorphous metal from damaging the wire; and
- terminals connected to the electronic component for surface mounting the electronic component to a circuit, and an overmolding covering at least a portion of the wire winding and providing a generally flat surface to assist in positioning of the component on a printed circuit board (PCB).

17. An electronic component for sensing magnetic fields comprising:
- a body having first and second ends with an elongated portion extending therebetween;
- an amorphous metal connected to an external surface of the elongated portion of the body;
- a wire winding wrapped about at least a portion of the amorphous metal;
- a spacer for separating the wire from the amorphous metal in order to prevent the amorphous metal from damaging the wire; and
- terminals connected to the electronic component for surface mounting the electronic component to a circuit, and an overmolding, the overmolding comprises at least one of a high temperature urethane and an adhesive film.

18. An electronic component according to claim 1 wherein the body comprises at least one of a ceramic and a plastic.

* * * * *